United States Patent [19]

Hattori

[11] Patent Number: 5,168,304
[45] Date of Patent: Dec. 1, 1992

[54] EXPOSURE APPARATUS

[75] Inventor: Ken Hattori, Tokyo, Japan

[73] Assignee: Nikon Corporation, Tokyo, Japan

[21] Appl. No.: 829,611

[22] Filed: Jan. 30, 1992

Related U.S. Application Data

[63] Continuation of Ser. No. 657,246, Feb. 15, 1991, which is a continuation of Ser. No. 537,153, Jun. 12, 1990, which is a continuation of Ser. No. 396,557, Aug. 21, 1989, abandoned.

[30] Foreign Application Priority Data

Aug. 22, 1988 [JP] Japan ................. 63-206276

[51] Int. Cl.⁵ ............... G03B 27/48; G03B 27/50; G03B 27/42; G03B 27/72
[52] U.S. Cl. ........................ 355/50; 354/4; 355/53; 355/68; 355/71
[58] Field of Search ............. 354/4; 355/50, 53, 68, 355/71

[56] References Cited

U.S. PATENT DOCUMENTS

| | | | |
|---|---|---|---|
| 3,072,014 | 1/1963 | Rawstron | 354/4 |
| 3,566,763 | 3/1971 | Knopf | 354/4 |
| 3,668,990 | 6/1972 | Hayes | 354/4 |
| 3,927,411 | 12/1975 | Lee et al. | 354/4 |
| 4,032,343 | 6/1977 | Deml et al. | 354/44 |
| 4,477,182 | 10/1984 | Takanashi et al. | 355/534 |
| 4,573,779 | 3/1986 | Deighton et al. | 354/4 |
| 4,655,584 | 4/1987 | Tanaka et al. | 355/53 |
| 4,910,549 | 3/1990 | Sugita | 355/53 |
| 5,028,955 | 7/1991 | Hayashida et al. | 355/53 |

Primary Examiner—Richard A. Wintercorn
Attorney, Agent, or Firm—Michael N. Meller

[57] ABSTRACT

An exposure apparatus for selectively exposing the peripheral portion of a circular substrate such as wafer for integrated circuit manufacturing purposes. In this exposure apparatus, the spot of an exposure light beam from a projecting system is projected onto the peripheral portion of a resist-coated surface of a substantially circular substrate in such a manner that a part of the spot projects from the peripheral edge of the substrate. The portion of the spot projecting from the peripheral edge of the substrate is received by a detector arranged opposite to the projecting system through the intermediary of the substrate peripheral portion so that the position of the substrate peripheral edge in the projected spot is detected in accordance with the contour position of the received spot portion. During rotation of the substrate, in accordance with the detection signal the projecting system is controlled to move in the radial direction of the substrate in response to the displacement of the substrate peripheral edge so that the exposure light beam always illuminated the peripheral portion of the substrate within a given dimensional extend in the radial direction. Further, in the present exposure apparatus the rotational speed of the substrate and the exposure conditions by the spot formed on the substrate peripheral portion by the light beam (the intensity and/or size of the integrated exposure light) are controlled in such a manner that the exposure light quantity applied to the substrate peripheral portion by the spot attains a predetermined proper exposure light quantity.

15 Claims, 3 Drawing Sheets

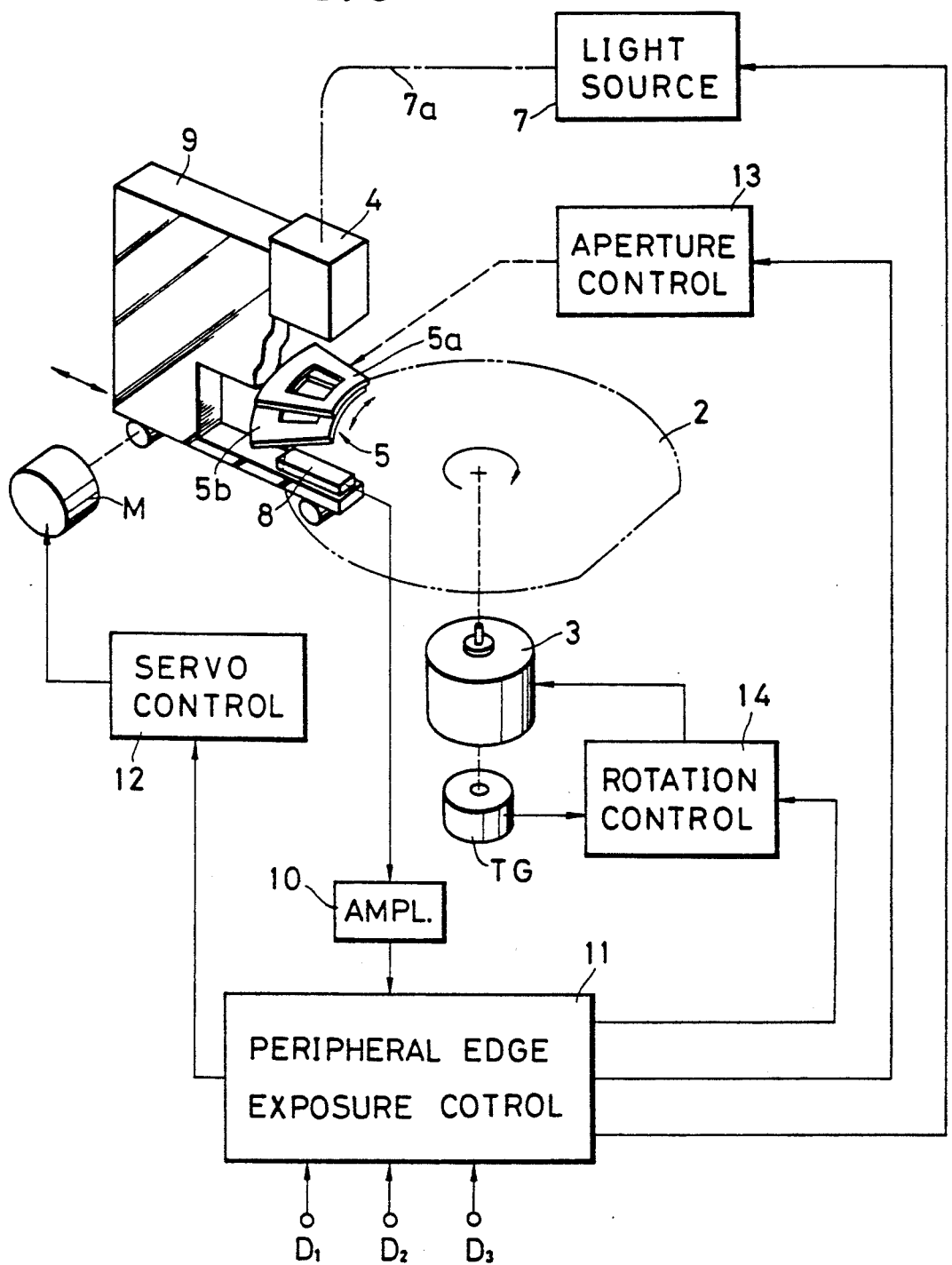

EXPOSURE APPARATUS

This application is a continuation of application Ser. No. 657,246, filed Feb. 15, 1991 which is a continuation of application Ser. No. 537,153, filed Jun. 12, 1990 which is a continuation of application Ser. No. 396,557, filed Aug. 21, 1989, now abandoned.

BACKGROUND OF THE INVENTION

1. Field of the Invention

The present invention relates to an exposure apparatus for selectively exposing the peripheral portion of a circular substrate such as a wafer for integrated circuit manufacturing purposes.

2. Description of the Prior Art

The manufacture of semiconductor devices has heretofore involved a problem that the resist applied to the surface of a silicon wafer or substrate to form a fine pattern therein tends to be peeled off particularly in the peripheral portion of the wafer during the transfer and other handling operations of the wafer within a semiconductor manufacturing apparatus and such peeled-off resist pieces give rise to various ill effects during the subsequent integrated circuit manufacturing operations.

In order to prevent peeling off of the resist in the peripheral portion of a wafer, it has been the practice in the past to selectively expose only the peripheral edge of the wafer to light by a special-purpose exposure apparatus to cure the resist. This conventional technique has been such that the exposure light beam is projected from a fixed position onto the peripheral portion of the wafer which is rotated in a plane and therefore it is impossible to accurately control the width of an exposure area in the wafer peripheral portion along the whole circumference of the wafer.

In other words, the ordinary wafer is formed in a part of its substantially circular outer periphery with a flat cut-off portion which is called as an orientation flat portion (hereinafter simply referred to as an OF portion) and adapted to determine the orientation of the wafer. Thus, there is a disadvantage that for instance, the width of an exposure area of the wafer peripheral portion is varied due to the tolerance for the outer diameter of the wafer, variation in the position at which the wafer is held and rotated and so on so that particularly when the cut-off at the OF portion 2a of the wafer 2 is large, the exposure area 2b is interrupted near the central portion of the OF portion 2a as shown in FIG. 6a or alternatively to ensure the exposure of the peripheral portion along the whole circumference without any interruption requires that the exposure area 2b of the peripheral portion is widened considerably as shown in FIG. 6b.

There is another disadvantage that conventionally the exposure light beam on the wafer perpheral portion has such a sectional shape that it forms a simple circular spot S as shown in FIG. 7a so that as shown in FIG. 7b, the integrated exposure light quantity P in the wafer peripheral portion is not uniform over the wafer radial distance D from the wafer edge position E so that if the spot is displaced in the wafer radial direction relative to the wafer, variation in the integrated exposure light quantity is caused and it is impossible to ensure uniform exposure of the peripheral portion of the wafer along its whole circumference with the minimum required exposure light quantity.

There is still another disadvantage that where the exposure of a wafer peripheral portion is effected by a special-purpose exposure apparatus provided independently of the main exposure apparatus provided essentially for the exposure of the pattern contained in a mask or an exposure apparatus incorporated in a resist coating equipment or resist developing equipment, it is difficult to utilize the data relating to the proper exposure light quantity already stored in the main exposure apparatus provided essentially for the exposure of the mask pattern in connection with the resist used, and consequently it is impossible to effect the proper exposure unless the exposure light quantity data for the peripheral portion exposure are separately administered.

SUMMARY OF THE INVENTION

It is the primary object of the present invention to provide an exposure apparatus capable of effecting the exposure of an area of a given width along the whole circumference of the peripheral portion of a substantially circular substrate such as a wafer efficiently with the proper exposure light quantity.

The above object is accomplished by the exposure apparatus of the present invention as defined by the appended claims.

More specifically, in accordance with a basic aspect of the present invention, the apparatus for effecting the exposure of the peripheral portion of the resist-coated surface of a substantially circular substrate in a plane includes means for holding the substrate on the plane, means for rotating the substrate held on the holding means, means for projecting onto the peripheral portion of the surface of the substrate a light beam of such characteristic that the resist is sensitive to the light beam to bring the substrate peripheral edge into its exposure area, means for detecting the relative positional relation between the light beam and the substrate peripheral edge in the radial direction of the substrate, means for moving the beam projecting means in the radial direction of the substrate, and means for dynamically controlling the moving means in accordance with the output of the detecting means in such a manner that the light beam illuminates the peripheral portion of the substrate over a predetermined substantially constant extent in the radial direction of the substrate while the substrate is rotated by the rotating means.

In accordance with another aspect of the present invention, the exposure apparatus further includes means for controlling the rotational speed of the rotating means, exposure condition control means for controlling the integrated exposure light intensity and/or size of the spot formed on the substrate peripheral portion by the light beam, and peripheral edge exposure control means for controlling the exposure condition control means and/or the rotational speed control means in such a manner that the exposure light quantity supplied to the substrate peripheral portion by the spot attains a predetermined proper exposure light quantity.

In accordance with the present invention, a spot of exposure light beam is projected onto the peripheral portion of the resist-coated surface of a substantially circular substrate (e.g., wafer) in such a manner that a part of the spot projects from the substrate peripheral edge. The detecting means is arranged opposite to the projecting means through the intermediary of the substrate peripheral portion so that the portion of the spot projecting from the peripheral edge of the substrate is received and the position of the substrate peripheral edge in the spot from the projecting means is detected in accordance with the contour position of the received spot portion. During the rotation of the substrate, in accordance with the detection signal the projecting means is controlled to move in the radial direction of the substrate in response to the displacement of the substrate peripheral edge such that the exposure light beam from the projecting means always illuminates the peripheral portion of the substrate within a given dimensional range in the radial direction. Thus, even if there are variations in size and shape among different substrates, the center of the substrate is eccentric with the center of rotation of the substrate or a cut-off portion is formed in a portion of the circular outer periphery as in the case of the OF portion of a wafer, the peripheral portion of the substrate surface is always exposed to the light within a given width thereof along the whole circumference.

Also, in accordance with the present invention, the quantity of exposure light can be controlled by utilizing the data relating to the proper exposure light quantities stored in the main exposure apparatus (e.g., a stepper) proper adapted for the exposure of the pattern contained in a mask (or reticle) as the corresponding information to the resist used and therefore the exposure of the peripheral portion can be effected using the proper exposure light quantity corresponding to the resist used without the administration of any separate data for peripheral portion exposure purposes.

In accordance with the present invention, while there is no particular limitation to the shape of the spot formed by the exposure light beam, in order that the integrated exposure light quantity corresponding to a given radial distance from the substrate peripheral edge may be maintained constant so as to effect the peripheral portion along the whole circumference more uniformly with the minimum required exposure light quantity, it is desirable that the spot formed on the exposure area by the light beam from the projecting means takes the form of a square spot or slit shape having its sides arranged in parallel to each other on a substrate radial direction or alternatively it is particularly preferable that the spot takes the form of a sector spot enclosed by a pair of large and small circular arcs which are substantially concentric with the center of rotation of the substrate and a pair of straight lines which are extended along two different radial directions from the center of the rotation and apart from each other by a certain angle between them. In order to produce such spot shape, the exposure apparatus of this invention may be provided with aperture means having an opening of a desired shape and arranged in a suitable position between the projecting means and the substrate peripheral portion. While the aperture means may be of a fixed opening type, it may be of the variable opening area type whose size is fixed in the substrate radial direction but variable in the substrate circumferential direction and in this case the aperture means may be used as a part of the exposure condition control means controlled by the peripheral edge exposure control means.

It is to be noted that where the exposure apparatus according to the invention is incorporated in the main exposure apparatus for mask pattern exposure purposes, the light source for substrate peripheral portion exposure purposes is provided independently of the main exposure light source for forming a pattern in the substrate internal area so that when controlling the integrated exposure light quantity for the substrate peripheral portion, the intensity and projection time of the exposure light beam can be separately varied as occasion demands along with the sectional area (spot size) of the exposure light beam and the rotational speed of the substrate. Since the exposure of the substrate peripheral portion does not required for the formation of a fine pattern and therefore it is desirable to effect the exposure with a high-intensity exposure light beam in a short period of time (at a high rotational speed) from the productivity point of view.

It is to be noted that the exposure apparatus of the present invention is well suited for combination with the substrate positioning apparatus disclosed in U.S. Pat. No. 4,655,584 granted to H. Tanaka et al and assigned to the assignee of the present application. In other words, while the substrate positioning apparatus is designed so that a turntable is positioned in a wafer transfer path just before a stage position at which the printing of a mask pattern is effected by a main exposure apparatus and after a wafer has been rotated in a horizontal plane by the turntable such that the OF portion of the wafer is oriented in a given direction, the wafer is moved onto the stage thereby effecting the rough positioning (prealignment) of the wafer mechanically in a short period. Thus, if the exposure apparatus of the present invention is incorporated in the vicinity of the turntable so as to effect the exposure of the whole circumference of the wafer peripheral portion in association with the rotary motion of the wafer by the turntable, during the waiting time for the mask pattern printing the exposure of the peripheral portion of the next wafer can be completed and therefore no deterioration of the throughput on the whole is caused.

As described hereinabove, in accordance with the present invention a dynamic control is performed so that while the peripheral edge of a substantially circular substrate is being detected, and exposure light beam always illuminates the peripheral portion of the rotating substrate with respect to a given radial area thereof, with the result that even if there are variations in size and shape among different substrates, the center of the substrate is eccentric with the center of rotation of the substrate or the substrate is formed with a cut off in the circular periphery thereof as in the case of the OF portion of a wafer, the surface peripheral portion of the substrate can always be exposed to the light over a given width along the whole circumference.

Also, when controlling the quantity of exposure light, the data relating to the proper exposure light quantities stored in the main exposure apparatus proper can be utilized and therefore the exposure can be efficiently effected with the proper exposure light quantity without the administration of separate data for peripheral portion exposure purposes.

In addition, the control of the exposure light quantity can be effected in combination with the exposure conditions and the rotational speed condition of the substrate and therefore the control having a high degree of freedom is possible.

This type of exposure apparatus is particularly well suited as an exposure apparatus for the manufacture of integrated circuits so that if the exposure of the peripheral portion is incorporated in the prealigning operation of a wafer, the occurrence of a reject due to the peeling off of the resist in the peripheral portion of the wafer can be prevented without deteriorating the throughput on the whole.

The above and other objects, features and advantages of the present invention will become more apparent from the following description of the embodiments taken in conjunction with the accompanying drawings.

BRIEF DESCRIPTION OF THE DRAWINGS

FIG. 5 is a block diagram for explaining the control system in the embodiment of the present invention.

DESCRIPTION OF THE PREFERRED EMBODIMENTS

Figure 1:
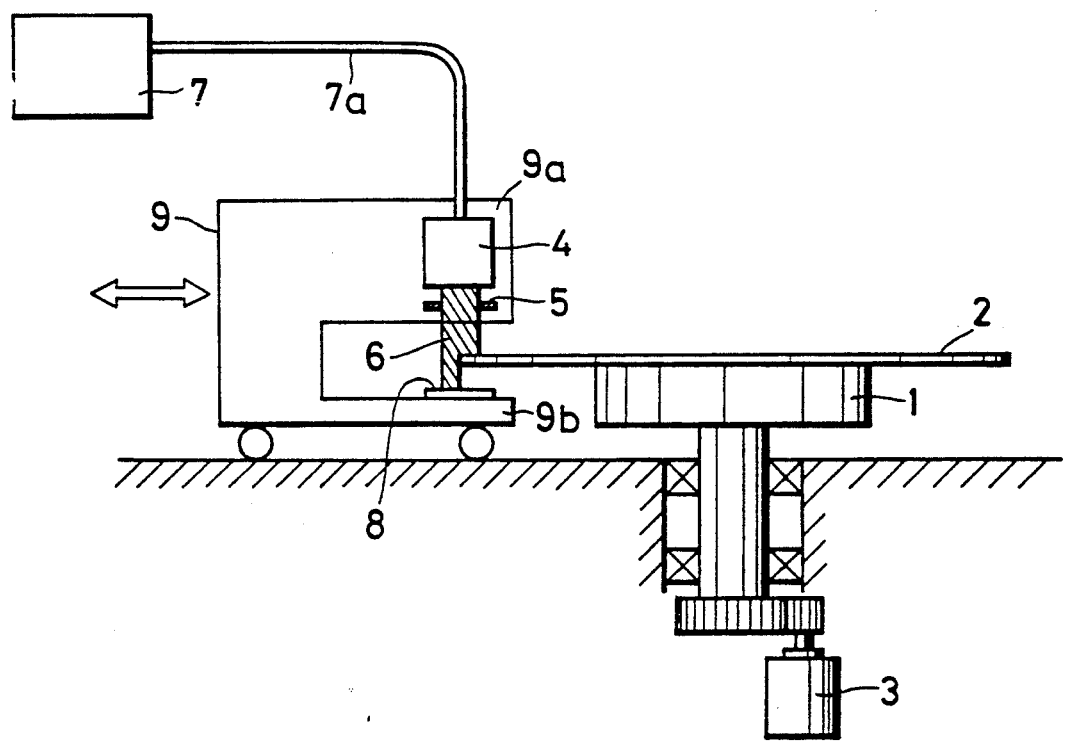
FIG. 1 is a schematic diagram showing an embodiment of the present invention.

FIG. 1 shows the principal part of an embodiment of the present invention, and this apparatus is incorporated in the wafer transfer unit of a pattern exposure apparatus such as a stepper, e.g., the turntable section of a substrate positioning apparatus desclosed in the previously mentioned U.S. Pat. No. 4,655,584.

In FIG. 1, numeral 1 designates the turntable in the wafer transfer path which is not shown and a wafer 2, which has been transferred, is vacuum chucked on the turntable 1 at such a position where the center of the wafer 2 approximately coincides with the center of rotation of the truntable 1. The turntable 1 is rotated at a controlled given speed by a motor 3 while horizontally holding the wafer 2 on its upper surface.

Figure 2:
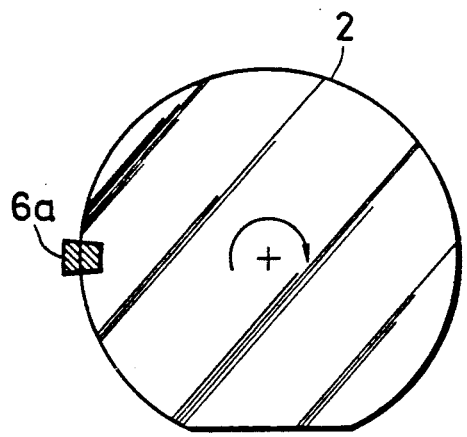
FIG. 2 is a plan view showing the sectional shape (spot shape) of the exposure light beam in the embodiment of the invention.
Figure 3:
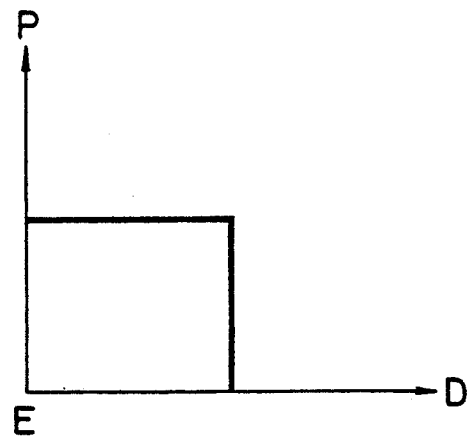
FIG. 3 is a graph showing the integrated exposure light quantity distribution by the spot of FIG. 2.

Arranged on one side of the turntable 1 is a moving support 9 which is radially movable toward or away from the turntable 1, and the moving support 9 includes forked upper and lower arms 9a and 9b which are extended toward the center of the turntable 1. Disposed on the upper arm 9a is a light emitter 4 for projecting an exposure light beam onto the peripheral portion of the wafer 2 and disposed on the lower arm 9b is a light detector 8 which opposes the light emitter 4. The light emitter 4 is provided with an aperture 5 having an opening shape adapted to confine an exposure light beam 6 to a given sectional shape, and in this embodiment the sectional shape of the exposure light beam 6 is such that a sector spot 6a is formed as shown in FIG. 2. In this case, the integrated light quantity distribution on the peripheral portion of the wafer 2 is such that an integrated exposure light quantity P of a given value is exhibited relative to a distance D along the wafer radial direction within the exposure area which extends from a wafer edge position E toward the wafer center as shown in FIG. 3.

The light emitter 4 includes a light source 7 which is different from the light source of a main exposure apparatus proper for mask pattern exposure purposes. The light source 7 produces the light beam 6 of a characteristic which sensitizes the resist applied uniformly to the surface of the wafer 2. The light source 7 need not be arranged in the vicinity of the light emitter 4 and therefore it is only necessary to arrange it in any part of the whole apparatus which has a relatively sufficient space so as to direct the light to the light emitter 4 through an optical liber 7a.

The light detector 8 comprises for example a photoelectric element such as a position sensor or CCD linear sensor, and the light detector 8 is arranged to face the light emitter 4 through the intermediary of the peripheral portion of the wafer 2 thereby receiving the portion of the exposure light beam 6 which is not interrupted by the wafer 2 to detect the edge position of the wafer 2.

In order that the wafer edge position detection may be effected accurately by the light detector 8, it is preferable that a suitable optical lens system (not shown) is arranged between the light emitter 4 and the wafer 2 to place the aperture 5 and the surface of the wafer 2 in a conjugate relation or alternatively the aperture 5 and the wafer 2 are arranged very near to each other if no lens system is arranged. In addition, by arranging in the light emitter 4 an optical system adapted to make uniform the exposure light intensity distribution in the spot 6a, it is possible to effect the exposure of the wafer peripheral portion under more proper conditions.

The light emitter 4 (including the aperture 5) and the light detector 8 are fixedly mounted as a unit on the moving support 9 and the moving support 9 is constructed so that it is guided by a guide mechanism which is not shown so as to go back and forth horizontally in the radial direction of the wafer 2.

When effecting the exposure of the wafer peripheral portion by use of the above-described mechanism, there is provied a peripheral edge exposure control unit whereby the data relating to the proper exposure light quantity for the resist used which is stored in the main exposure apparatus, is received to control the whole exposure operation of the wafer peripheral portion, and the peripheral edge exposure control unit determines the exposure conditions (the exposure light intensity, projection time, aperture opening or spot size, etc.,) and the rotational speed of the turntable 1.

In addition, the peripheral edge exposure control unit receives the preset data relating to the required exposure area (the radial distance from the wafer edge) and the wafer edge detection signal from the light detector 8 to generate on the basis thereof a signal for controlling the movement of the moving support 9.

Figure 4:
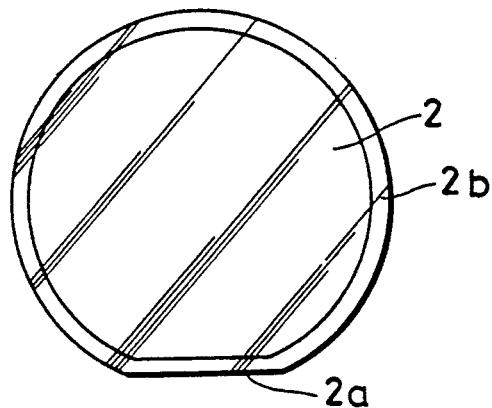
FIG. 4 is a plane view for explaining the exposure area in the peripheral portion of the substrate in the embodiment of the present invention.
Figure 6A:
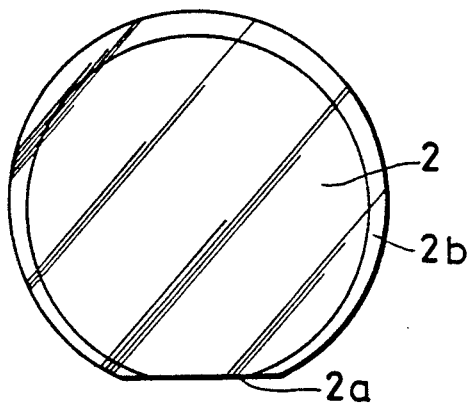
FIGS. 6a and b are plane views for explaining the exposure areas in the peripheral portions of the substrates according to the conventional apparatus.
Figure 6B:
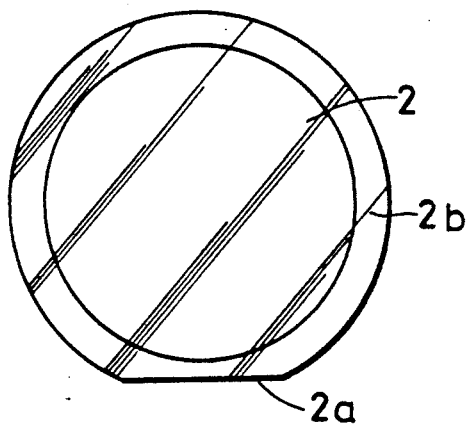
Figure 7A:
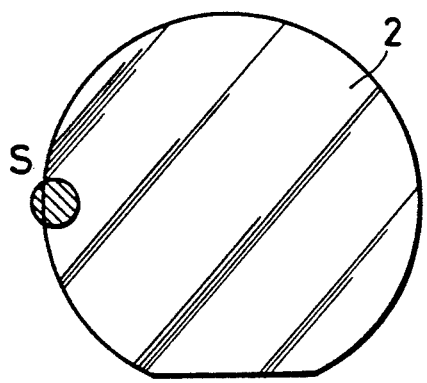
FIGS. 7a and 7b are respectively a plan view showing the sectional shape of an exposure light beam in a conventional apparatus and a graph showing the integrated exposure light quantity distribution.
Figure 7B:
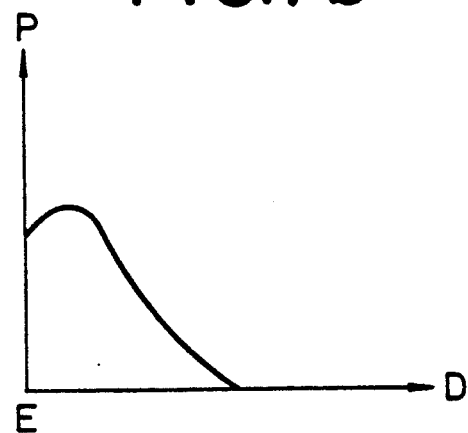

In other words, when the turntable 1 is rotated at a given speed and the exposure is started, in response to the movement control signal, the position of the moving support 9 is servocontrolled in such a manner that the area extending to the given distance from the wafer edge is always exposed to the exposure light beam 6 emitted from the light emitter 4. As a result, as shown in FIG. 4, the exposure light beam 6 is projected onto the uniform width (the exposure area 2b) including the OF portion 2a in the peripheral portion along the whole circumference of the wafer 2.

Next, the exposure control of the wafer peripheral portion according to this embodiment will be described in greater detail with reference to the block diagram of FIG. 5.

In the Figure, peripheral edge exposure control unit 11 receives as its imputs data $D_1$ relating to the required exposure area of the wafer peripheral portion, data $D_2$ relating to the proper exposure light quantity, and data D3 relating to the on-off timing of the light source 7 from the main exposure apparatus proper.

In accordance with the data $D_2$ relating to the proper exposure light quantity, the peripheral edge exposure control unit 11 determines the exposure conditions (the intensity of the exposure light beam 6, the projection time, the opening area of the aperture 5, etc.,) and the rotational speed of the turntable 1 and it sends a control command signal to each of the light source 7, an aperture control system 13 and a rotation control system 14.

It is to be noted that in the present embodiment the aperture 5 is composed of shield plates 5a and 5b each of which is formed with a sector opening defined by two large and small circular arcs which are substantially concentric with the center of wafer rotation and two straight lines which are extended along two different radial directions from the center of wafer rotation and apart from each other by a certain angle, and it is constructed so that the shield plates 5a and 5b are relatively rotated about the same shaft on the center of wafer rotation so as to vary the width of the composite slit opening formed by the sector openings of the two plates as shown in FIG. 5. In other words, where the intensity of the exposure light beam 6 from the light emitter 4 is maintained constant, to increase the rotational speed of the turntable 1 requires that the slit opening width of the aperture 5 is decreased and conversely to decrease the rotational speed requires that the slit opening width is increased.

It is to be noted that when determining the exposure conditions, with the moving support 9 being suitably retreated from the wafer 2, the whole spot of the exposure light beam 6 can be received by the light detector 8 to measure and calibrate the intensity of the exposure light quantity and in this way it is possible to prevent the exposure light quantity from being decreased unexpectedly due to deterioration of the light source or the like. Where the intensity of the exposure light beam is decreased by the deteriorated light source, the slit opening width of the aperture 5 can be increased so as to ensure the desired exposure light quantity while maintaining constant the rotational speed of the turntable 1. This is advantageous from the standpoint of maintaining constant the throughput of the wafer processing.

Then, when the given speed command signal is applied to the rotation control system 14 from the peripheral edge exposure control unit 11, the turntable 1 is rotated at the given speed by the motor 3. A tachometer generator TG is connected to the motor 3 and the rotational speed is fed back to the rotation control system 14, thereby always rotating the turntable 1 at a constant rotational speed in accordance with the commanded rotational speed.

When an exposure start signal (light source turn-on signal) of the data $D_3$ is applied to the peripheral edge exposure control unit 11 which in turn generates a command signal, the light source 7 responds to the command signal to produce an exposure light of a given intenity and this exposure light is transmitted through the optical fiber 7a, thereby projecting the exposure light beam 6 from the light emitter 4.

The moving support 9 is subjected to position-servocontrol so that the light emitter 4 and the light detector 8, which are supported on the moving support 9, are respectively positioned above and below the peripheral portion of the wafer 2 at a position corresponding to the required exposure area given by the data $D_1$.

In other words, the light detector 8 receives that portion of the exposure light beam 6 which is not interrupted by the peripheral portion of the wafer 2 thereby generating a detection signal having an information content indicating where the edge of the wafer 2 is positioned in the spot 6a. This detection signal is amplified by an amplifier 10 and then applied to the peripheral edge exposure control unit 11. The peripheral edge exposure control unit 11 compares the the data $D_1$ relating to the required exposure area and the detection signal from the light detector 8 to send a position command signal to a servo control unit 12.

In response to the position command signal from the peripheral edge exposure control unit 11, the servo control unit 12 sends a drive signal to a motor M in such a manner that the relative positional relation between the exposure light beam 6 and the wafer edge is always maintained constant and the movement of the moving support 9 supporting the light emitter 4 and the light detector 8 is subjected to position servocontrol. As a result, the area of an arbitrarily given destance in the radial direction from the wafer edge toward the wafer center or the area of a constant width is always uniformly exposed to the light during the rotation of the wafer 2.

After the passage of a given exposure time for the whole wafer circumference determined in accordance with the proper exposure light quantity, the wafer size and the table rotational speed, a light source turn-off signal according to the data $D_3$ is applied to the peripheral edge exposure control unit 11 so that the light source 7 stops the production of the exposure light and the turntable 1 is stopped at a predetermined rotational angular position through a given sequence of operations, thereby completing the peripheral portion exposure of one wafer.

While, in the above-described embodiment, the exposure apparatus of this invention is incorporated in the turntable section of the wafer transfer system of the positioning apparatus for wafer prealignment purposes, the present invention is not limited thereto and it may be embodied in combination with a resist coating apparatus or resist developing apparatus. Further, while, in the above-described embodiment, the light detector 8 is mounted on the moving support 9, it is possible to arrange so that the light detector 8 is separately arranged in place and only the light emitter 4 and the aperture 5 are mounted on the moving support 9 thereby reducing the might borne by it to improve the response to the position servocontrol.

What is claimed is:

1. In an exposure apparatus for exposing a peripheral portion of a resist-coated surface of a substantially circular substrate in a plane, the improvement comprising:
    means for holding said substrate on said plane;
    means for rotating said substrate held by said holding means in said plane;
    means for projecting a light beam of a characteristic which sensitizes said resist onto the peripheral portion of the surface of said substrate in a manner that a peripheral edge of said substrate is brought into an exposure area of said light beam during said rotation;
    means for detecting a relative positional relation between said light beam and said substrate peripheral edge in a radial direction of said substrate;
    means for moving said projecting means in the radial direction of said substrate; and means responsive to an output of said detecting means to dynamically control said moving means in a manner that said light beam illuminates the peripheral portion of said substrate over a predetermined substantially constant extent in the radial direction thereof during the rotation of said substrate by said rotation means.

2. An exposure apparatus according to claim 1, further comprising aperture means mounted to said projecting means for limiting in said exposure area the size of spot formed by said light beam projected from said projecting means.

3. An exposure apparatus according to claim 2, wherein said aperture means includes two sector openings each thereof being defined by a pair of large and small circulare arcs which are substantially concentric with the center of rotation of said substrate and a pair of straight lines which are extended along two different radial directions from the center of rotation and apart from each other by a certain angle.

4. An exposure apparatus according to claim 1, wherein said detecting means includes photoelectric conversion means for receiving a spot of said light beam partly interrupted by the peripheral portion of said substrate to generate an electric signal.

5. An exposure apparatus according to claim 1, wherein said moving means includes a moving support carrying thereon said projecting means and said detecting means as a unit.

6. An exposure apparatus according to claim 1, wherein said projecting means comprises a light emitter mounted on said moving means, a light source arranged at a position apart from said light emitter, and light transmitting means for directing an exposure light produced from said light source to said light emitter.

7. In an exposure apparatus for exposing a peripheral portion of a resist-coated surface of a substantially circular substrate in a plane, the improvement comprising:
means for holding said substrate on said plane;
means for rotating said substrate held by said holding means in said plane;
means for projecting a light beam of a characteristic which sensitizes said resist onto the peripheral portion of the surface of said substrate in a manner that a peripheral edge of said substrate is brought into an exposure area of said light beam during said rotation;
means for detecting a relative positional relation between said light beam and said substrate peripheral edge in a radial direction of said substrate;
means for moving said projecting means in said radial direction of said substrate;
means responsive to an output of said detecting means to dynamically control said moving means in a manner that said light beam illuminates the peripheral portion of said substrate over a predetermined substantially constant extent in the radial direction of said substrate during the rotation of said substrate by said rotating means;
means for controlling a rotational speed of said rotating means;
exposure condition control means for controlling an integrated exposure light insentity and/or size of a spot formed on the peripheral portion of said substrate by said light beam; and
peripheral edge exposure control means for controlling said exposure condition control means and/or said rotational speed control means in a manner that the quantity of exposure light applied to said substrate peripheral portion by said spot attains a predetermined proper exposure light quantity.

8. An exposure apparatus according to claim 7, wherein said exposure condition control means includes variable aperture means for variably limiting the size in said substrate circumferential direction of said spot formed on said exposure area by said light beam projected from said projecting means, said variable aperture means being mounted to said projecting means.

9. An exposure apparatus according to claim 8, wherein said variable aperture means comprises a pair of sector openings each thereof being defined by a pair of large and small circular arcs which are substantially concentric with the center of rotation of said substrate and a pair of straight lines which are extended along two different radial directions from the center of rotation and apart from each other by a certain angle, said angle being variable.

10. An exposure apparatus according to claim 7, wherein said projecting means comprises a light emitter mounted on said moving means, a light source arranged at a position apart from said light emitter, and light transmitting means for directing an exposure light produced from said light source to said light emitter.

11. An exposure apparatus according to claim 10, wherein the intensity or duration time of the light produced by said light source is controlled by said peripheral edge exposure control means.

12. In an exposure apparatus for exposing a peripheral portion of a resist-coated surface of a substantially circular substrate in a plane, the improvement comprising:
turntable means for holding said substrate on said plane;
driving means for rotating said turntable means;
means for projecting a light beam of a characteristic which sensitizes said resist onto the peripheral portion of said substrate in a manner that a peripheral edge of said substrate is brought into an exposure area of said light beam during said rotation;
photoelectric conversion means for receiving said light beam at a position opposing said projecting means through the intermediary of said substrate peripheral edge to detect a relative positional relation of said substrate peripheral edge with said light beam;
means for moving said projecting means in a radial direction of said substrate;
servo control means responsive to an output of said photoelectric conversion means to subject said moving means to positional servo control in a manner that said light beam illuminates the peripheral portion of said substrate over a predetermined substantially constant extent in the radial direction of said substrate during the rotation of said substrate by said turntable means;
means for feedback controlling a rotational speed of said driving means;
Variable aperture control means for variably controlling the size in said substrate circumferential direction of a spot formed on the peripheral portion of said substrate by said light beam; and
peripheral edge exposure control means for controlling said variable aperture control means and said rotational speed control means in a manner that an exposure light quantity applied to said substrate peripheral portion by said spot attains a predetermined proper exposure light quantity.

13. An exposure apparatus according to claim 12, wherein said moving means comprises a moving support carrying thereon said projecting means and said photoelectric conversion means in a unit.

14. An exposure apparatus according to claim 12, wherein said projecting means comprises a light emitter mounted on said moving means, a light source arranged at a position apart from said light emitter, and light transmitting means for directing an exposure light produced from said light source to said light emitter.

15. An exposure apparatus according to claim 12, wherein said variable aperture means includes a pair of sector openings each thereof being defined by a pair of large and small circular arcs which are substantially concentric with the center of rotation of said substrate and a pair of straight lines which are extended along two different radial directions from the center of rotation and apart from each other by a certain angle, and wherein said angle is variable.

* * * * *